United States Patent
Brodie et al.

(10) Patent No.: US 9,214,344 B1
(45) Date of Patent: Dec. 15, 2015

(54) PILLAR-SUPPORTED ARRAY OF MICRO ELECTRON LENSES

(71) Applicant: KLA-Tencor Corporation, Milpitas, CA (US)

(72) Inventors: Alan D. Brodie, Palo Alto, CA (US); Yehiel Gotkis, Belmont, CA (US); Allen Carroll, San Jose, CA (US); Leonid Baranov, Sunnyvale, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 12 days.

(21) Appl. No.: 14/296,960

(22) Filed: Jun. 5, 2014

Related U.S. Application Data

(63) Continuation of application No. PCT/US2013/029444, filed on Mar. 6, 2013.

(60) Provisional application No. 61/612,648, filed on Mar. 19, 2012.

(51) Int. Cl.
   *H01L 21/20* (2006.01)
(52) U.S. Cl.
   CPC ..................................... *H01L 21/20* (2013.01)
(58) Field of Classification Search
   None
   See application file for complete search history.

(56) References Cited

U.S. PATENT DOCUMENTS

| | | |
|---|---|---|
| 6,687,282 B2 * | 2/2004 | Kim et al. ............... 372/96 |
| 7,358,512 B1 | 4/2008 | Lordi |
| 8,253,119 B1 | 8/2012 | Brodie et al. |
| 2002/0039376 A1 | 4/2002 | Kim et al. |
| 2009/0114837 A1 | 5/2009 | Grella et al. |
| 2010/0084566 A1 | 4/2010 | Kim |
| 2012/0037813 A1 | 2/2012 | Lanio |

OTHER PUBLICATIONS

International Search Report and Written Opinion of the International Searching Authority for Application No. PCT/US2013/029444, Jun. 27, 2013, 10 sheets.

* cited by examiner

*Primary Examiner* — Kyoung Lee
(74) *Attorney, Agent, or Firm* — Okamoto & Benedicto LLP

(57) ABSTRACT

One embodiment relates to a pillar-supported array of micro electron lenses. The micro-lens array includes a base layer on a substrate, the base layer including an array of base electrode pads and an insulating border surrounding the base electrode pads so as to electrically isolate the base electrode pads from each other. The micro-lens array further includes an array of lens holes aligned with the array of base electrode pads and one or more stacked electrode layers having openings aligned with the array of lens holes. The micro-lens array further includes one or more layers of insulating pillars, each layer of insulating pillars supporting a stacked electrode layer. Another embodiment relates to a method of fabricating a pillar-supported array of micro electron lenses. Other embodiments, aspects and features are also disclosed.

20 Claims, 19 Drawing Sheets

PILLAR-SUPPORTED ARRAY OF MICRO ELECTRON LENSES

CROSS-REFERENCE TO RELATED APPLICATION(S)

The present application is a continuation of International Patent Application No. PCT/US2013/029444, filed Mar. 6, 2013, entitled "Pillar-Supported Array of Micro Electron Lenses", the disclosure of which is hereby incorporated by reference. International Patent Application No. PCT/US2013/029444 claims the benefit of U.S. Provisional Patent Application No. 61/612,648, filed Mar. 19, 2012, entitled "Pillar Based Digital Pattern Generator (DPG) for Reflective Electron Beam Lithography (REBL)," the disclosure of which is hereby incorporated by reference.

STATEMENT REGARDING FEDERALLY SPONSORED RESEARCH OR DEVELOPMENT

This invention was made with Government support under Agreement No. HR0011-07-9-0007 awarded by DARPA. The Government has certain rights in the invention.

BACKGROUND

1. Technical Field

The present invention relates a dynamic pattern generator for use in electron beam lithography and other applications.

2. Description of the Background Art

A dynamic pattern generator (DPG) may be used for electron beam lithography or other applications. Independently-controllable voltages may be applied to pixels or a DPG. The voltages may determine whether each pixel is in an ON state or an OFF state. For example, the ON state may correspond to the reflection of incident electrons by the pixel, and the OFF state may correspond to the absorption or diffraction of the incident electrons by the pixel.

SUMMARY

One embodiment relates to a pillar-supported array of micro electron lenses. The micro-lens array includes a base layer on a substrate, the base layer including an array of base electrode pads and an insulating border surrounding the base electrode pads so as to electrically isolate the base electrode pads from each other. The micro-lens array further includes an array of lens holes aligned with the array of base electrode pads and one or more stacked electrode layers having openings aligned with the array of lens holes. The micro-lens array further includes one or more layers of insulating pillars, each layer of insulating pillars supporting a stacked electrode layer.

Another embodiment relates to a method of fabricating a pillar-supported array of micro electron lenses. A base layer is formed on a substrate, the base layer including an array of base electrode pads separated by insulating material. A first stacked electrode layer is formed above the base layer. A first array of insulating pillars is formed, the first array of insulating pillars supporting the first stacked electrode layer above the base layer. An array of lens holes is formed, the lens holes being aligned to the array of base electrode pads.

Another embodiment relates to a device for dynamically patterning an electron beam. The device includes a base layer on a substrate. The base layer includes an array of base electrode pads to which individually-controllable voltages are applied. The device further includes an array of lens holes aligned with the array of base electrode pads, a plurality stacked electrode layers, and a plurality of layers of insulating pillars. Each stacked electrode layer includes an array of openings aligned with the array of lens holes. Each layer of insulating pillars supports one stacked electrode layer.

Other embodiments, aspects and feature are also disclosed.

DETAILED DESCRIPTION

Applicants have determined that one of the issues with previous DPG designs is that the charging of the insulators in the device reduces the efficiency of the DPG lenslets. To mitigate such insulator charging, a conformal conductive coating may be applied, but such a coating has been observed to degrade thermally and electrically over time.

The present disclosure provides a technique for overcoming the above-discussed issues. In accordance with an embodiment of the invention, a support structure is formed using relatively small pillars in the interstitial regions of the electron lenslets of a dynamic pattern generator. In such a support structure, the insulating material is advantageously located farther away from the electron beam while the stacked electrode layers are still supported. In contrast, previous designs have wells in which the lenslet insulators are flush or nearly flush with the electrode openings.

Figure 1:
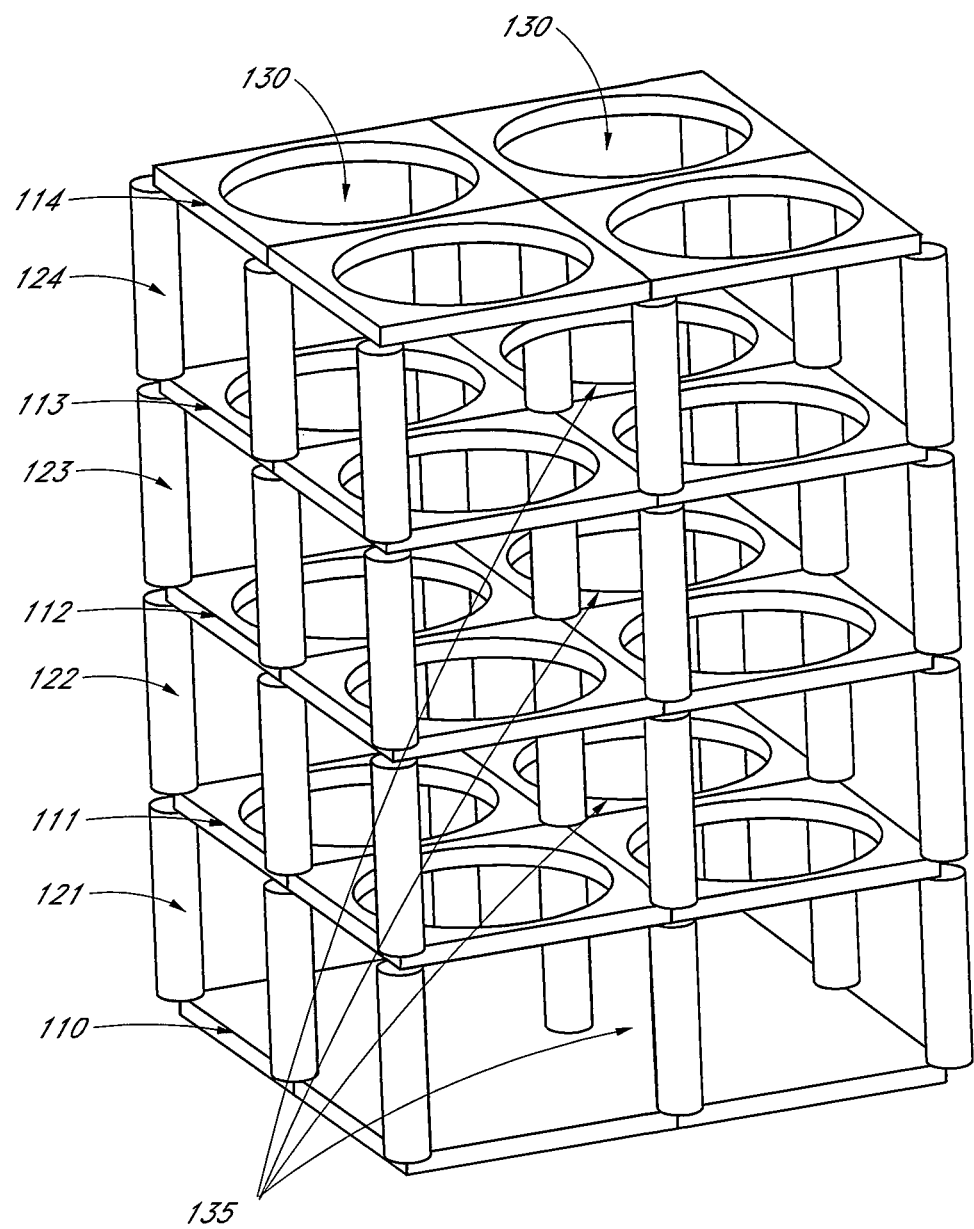
FIG. 1 is a perspective view of a pillar-supported array of microlenses for a dynamic pattern generator in accordance with an embodiment of the invention.

FIG. 1 is a perspective view of a pillar-supported array of micro electron lenses for a dynamic pattern generator in accordance with an embodiment of the invention. The pillar-supported array 100 of micro electron lenses may include multiple stacked electrodes configured to collect, focus, and extract electrons. While a 2×2 array of micro electron lenses is depicted in FIG. 1, it is understood that a practical array would be much larger. As just one example, the array may be a 4096×248 array of micro electron lenses.

As shown in FIG. 1, an exemplary implementation of the array 100 may include the base electrode layer 110 and four stacked electrodes layers (111, 112, 113, and 114). Other embodiments may include a different number of stacked electrodes. Each stacked electrode layer is, in effect, a micro electron lens array fabricated on a silicon substrate.

The multiple stacked electrode layers (111, 112, 113, and 114) may be separated and supported by insulating pillars (121, 122, 123 and 124, respectively). Each stacked electrode layer may be titanium nitride, or another conductive material and may have a separately-controlled voltage applied to that layer. The insulating pillars may be silicon nitride or another insulating material.

Figure 2:
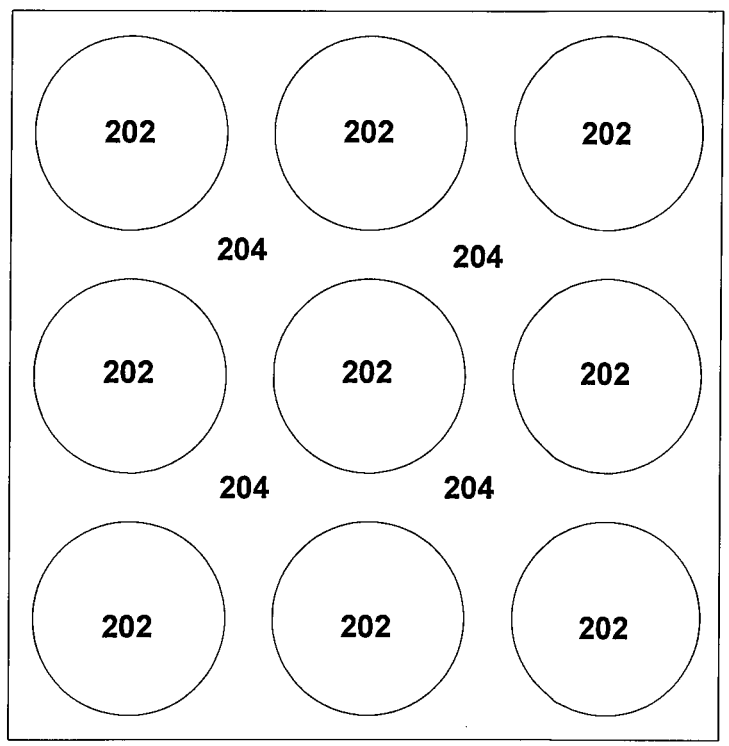
FIG. 2 is a planar view of the structure of a base electrode layer in accordance with an embodiment of the invention.

Below the first (lowest) stacked electrode layer 111 is a base electrode layer 110. A planar view of the structure of the base electrode layer 110 is depicted in FIG. 2. As shown in FIG. 2, the base electrode layer 110 includes base electrode pads 202 which are electrically insulated from each other by insulating regions 204. A separate voltage may be applied to each pad 202. The voltage applied may be switchably-controlled for each individual pad.

The base electrode pads 202 may be formed using a different metal than that used to form the stacked electrodes (111-114) such that selective etching may be performed that etches the stacked electrodes but not the base electrode pads 202. For example, the base electrode pads 202 may be copper, and the stacked electrodes (111-114) may be aluminum or an aluminum alloy. The insulating regions 204 may be silicon nitride or silicon oxynitride, for example. While a 3×3 array of base electrode pads are depicted for purpose of simplicity, it is understood that a practical array will be much larger. As just one example, the array may be a 1024×128 array of base electrode pads.

Returning to FIG. 1, the openings 130 through the electrodes may be aligned concentrically over the base electrode pads 202 so as to define the lens holes (i.e. the open wells for the pixels) of the array. As depicted, there is are four open spaces 135 (one for each stacked electrode layer) between each pair of adjacent lens holes. Each open space 135 is framed by two vertical columns on the left and right, and two horizontal layers on the top and bottom. At the base of each lens hole is a base electrode pad 202. By controlling the voltage applied to an individual base electrode pad 202, the pixel associated with that pad 202 may be controlled so as to be in an ON state (e.g. reflecting the incident electrons) or an OFF state (e.g., absorbing or diffracting the incident electrons).

An exemplary implementation may have the following dimensions and applied voltages. However, it is expected that the dimensions and applied voltages will vary depending on the use for which the array 100 is intended.

In the exemplary implementation, each pixel opening 130 to a lens hole may be 1.4 microns across and each stacked electrode layer (111, 112, 113 and 114 may be 1.0 microns above the electrode layer beneath it. In other words, the first stacked electrode layer 111 may be 1.0 microns above the base electrode layer 110, the second stacked electrode layer 112 may be 1.0 microns above the first stacked electrode layer 111, and so on. In the exemplary implementation, the first and second stacked electrode layers (111 and 112) may both have an applied voltage of negative 2.5 volts (V), the third stacked electrode layer 113 may have an applied voltage of positive 15 V, and the fourth stacked electrode layer 114 may have an applied voltage of positive 0.5 V. Finally, each base electrode pad 202 in the base electrode layer 110 may have an applied voltage that may be switched individually between zero volts and negative 5 V, for example, in order to achieve the OFF and ON states, respectively.

In this exemplary implementation, the negative voltages applied to the first and second stacked electrode layers (111 and 112) may be used to focus the electrons as these electrode layers are near the bottom of each lens hole. The relatively strong positive voltage applied to the third stacked electrode layer 113 (which is just beneath the uppermost electrode) may be used to both focus the incoming electrons by drawing them into the lens hole and extract the reflected electrons by drawing them out of the lens hole. The relatively weak positive voltage applied to the fourth stacked electrode layer (the uppermost electrode in this embodiment) 114 may be used to both screen the insulating pillars from the incoming electron current and to deflect the incoming electrons with lower energy towards the inside of a nearest lens hole.

FIGS. 3A through 3I are cross-sectional diagrams illustrating steps in a process of manufacturing a pillar-supported array of microlenses with a single stacked electrode in accordance with an embodiment of the invention. The micro electron lens array formed in this process includes a single electrode layer stacked above a base electrode layer. The following description indicates materials and processes used in an exemplary embodiment, but functionally similar materials and processes may also be used in other embodiments.

Figure 3A:
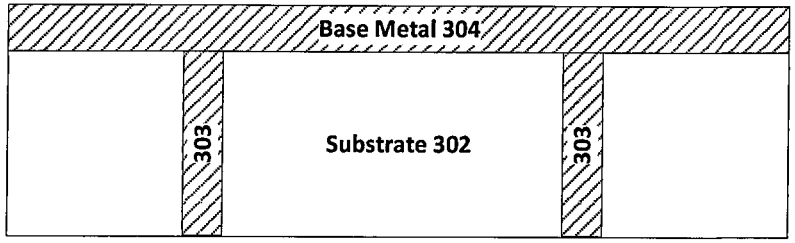
FIGS. 3A through 3I are cross-sectional diagrams illustrating steps in a process of manufacturing a pillar-supported array of micro electron lenses in accordance with an embodiment of the invention.

FIG. 3A depicts a structure including a substrate 302, a base metal layer 304 deposited on the substrate 302, and conductive vias 303 through the substrate 302 to the base metal layer 304. The substrate 302 may be silicon, for example. The base metal layer 304 and the conductive vias 303 may be formed by etching or laser ablation and metal deposition.

Figure 3B:
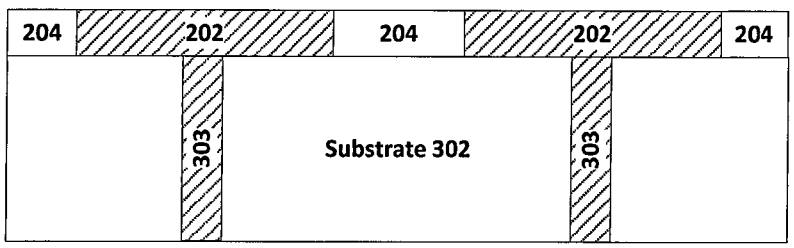

FIG. 3B depicts the structure after electrically-isolated base electrode pads 202 have been formed in the base metal layer 304. The base electrode pads 202 may be formed by depositing a patterned resist layer which covers the pad areas and has openings between the pad areas, etching the base metal layer 304 through the openings of the patterned resist layer, and forming the insulating regions 204 (which may be silicon nitride or silicon oxynitride, for example) to fill the etched regions. The pad areas may be aligned so that the base electrode pads 202 are electrically connected to the conductive vias 303.

Figure 3C:
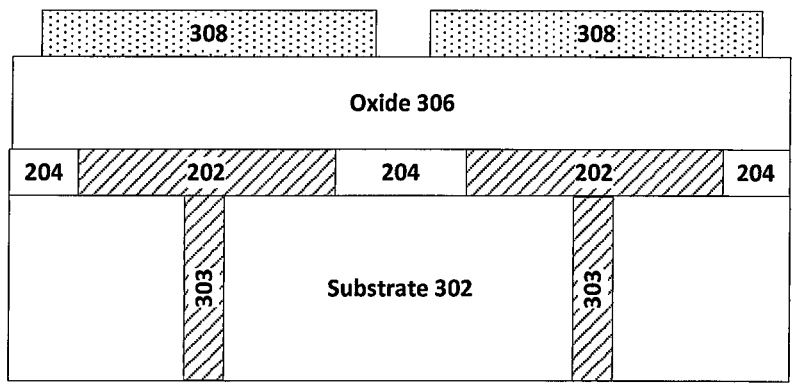

FIG. 3C depicts the structure after a first sacrificial oxide layer 306 is deposited, and a first pillar-patterned resist layer 308 is formed on the first sacrificial oxide layer 306. The first pillar-patterned resist layer 308 is patterned with openings corresponding to the positions of the pillars to be formed so as to support the first stacked electrode layer.

Figure 3D:
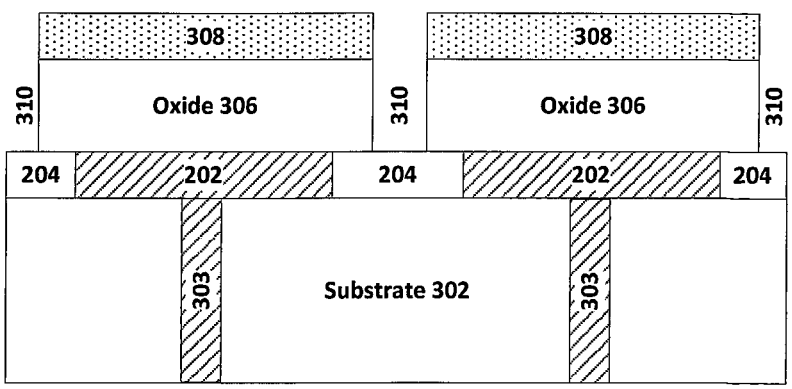

FIG. 3D depicts the structure after the pillar pattern is etched through the first sacrificial oxide layer 306 to form the pillar openings 310. The etching may be performed either by a dry etch process or a wet etch process. The etching may be selective such that it stops etching at the insulating regions 204 (which may be silicon nitride or silicon oxynitride, for example).

Figure 3E:
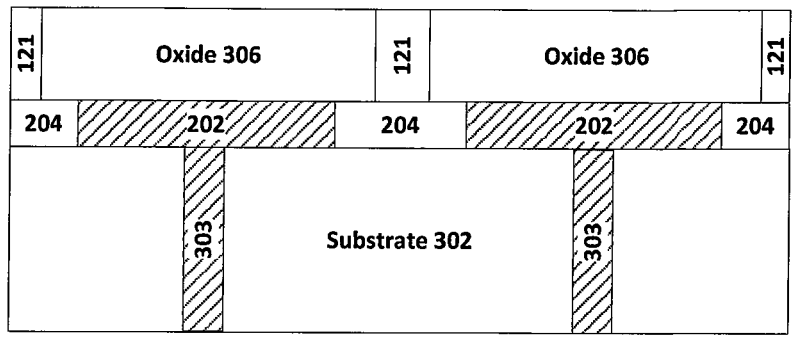

FIG. 3E depicts the structure after the pillar material for the first layer of pillars 121 is deposited and then the surface is planarized. In one embodiment, the pillar material may be silicon nitride or silicon oxynitride, for example.

Figure 3F:
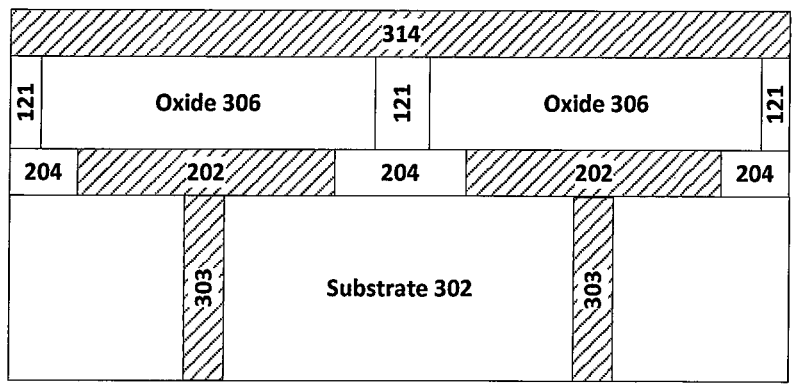

FIG. 3F depicts the structure after a first stacked conductive layer 314 is deposited on the planarized surface. The first stacked conductive layer 314 may be formed by depositing a conductive material. In one embodiment, the first stacked conductive layer 314 may be a different metal from the metal used for the base electrode pads 202 to enable selective etching.

Figure 3G:
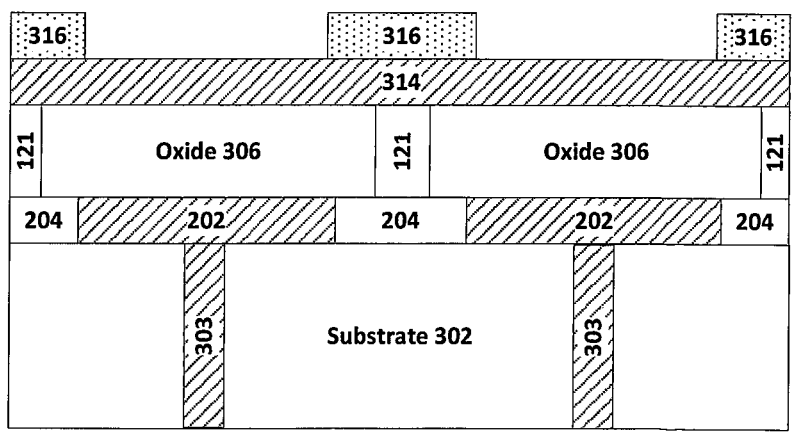

FIG. 3G depicts the structure after a hole-patterned resist layer 316 is formed over the first stacked conductive layer 314. The hole-patterned resist layer 316 has openings 130 for forming the lens holes above the base electrode pads 202.

Figure 3H:
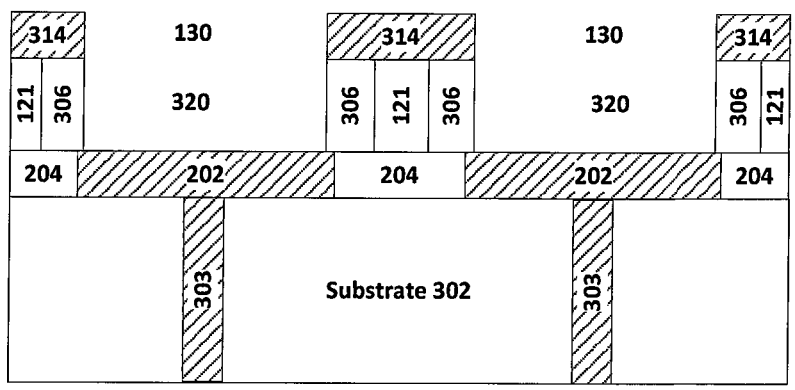
Figure 3I:
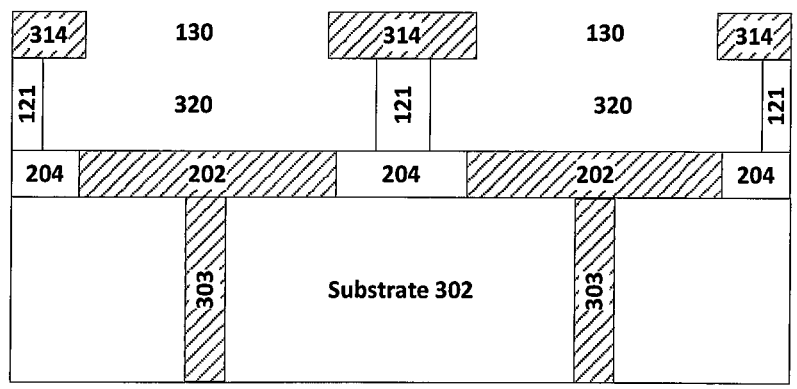

FIG. 3H depicts the structure after etching of the lens holes 320 and removal of the hole-patterned resist layer 316. The lens holes 130 may be etched using a selective etch process (which may include one or more separate etch steps) which etches the first stacked conductive layer 314 and the oxide 306 and stops at the metal of the base electrode pads 202. After this step, the remaining portion of the first stacked conductive layer 314 forms the first stacked electrode layer 111. Finally, FIG. 3I depicts the structure after the remaining oxide 306 around the pillars 121 is etched away. The result is a pillar-supported array of micro electron lenses that includes one stacked electrode layer over the base electrode layer. Note that, as depicted in the perspective view of FIG. 1, there is an open space 135 between each pair of adjacent lens holes 320.

Note that, while FIGS. 3A-3I illustrate a process for forming a single stacked electrode layer over a base electrode pad array, it is anticipated that multiple stacked electrode layers will be used in practical applications so as to provide further parameters to adjust the focusing and other characteristics of the micro electron lenses. Processes for forming multiple stacked electrode layers are described below.

FIGS. 4A through 4G are cross-sectional diagrams illustrating steps in a process of manufacturing a pillar-supported micro electron lens array with two stacked electrode layers in accordance with an embodiment of the invention. The process begins with the same steps as described above in relation to FIGS. 3A to 3F. In other words, the process includes the steps described above in relation to 3A to 3F followed by the steps described below in relation to FIGS. 4A to 4G.

Figure 4A:
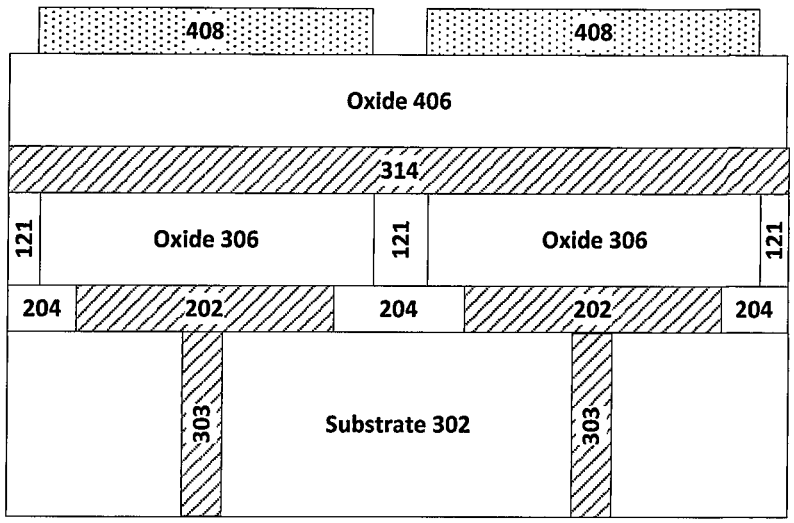
FIGS. 4A through 4G are cross-sectional diagrams illustrating steps in a process of manufacturing a pillar-supported micro electron lens array with two stacked electrode layers in accordance with an embodiment of the invention.

After depositing the first stacked conductive layer 314 per FIG. 3F, a second sacrificial oxide layer 406 is deposited, and a second pillar-patterned resist layer 408 is formed on the second sacrificial oxide layer 406, as depicted in FIG. 4A. The second pillar-patterned resist layer 408 is patterned with openings corresponding to the positions of the pillars to be formed so as to support the second stacked electrode layer.

Figure 4B:
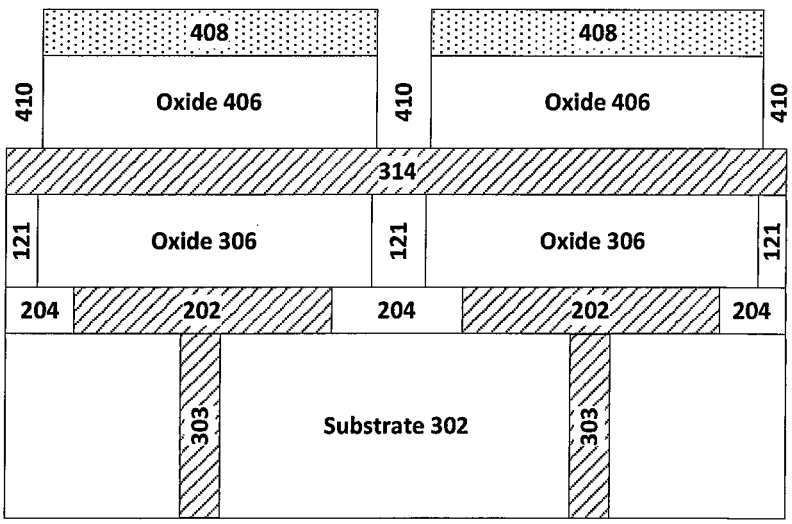

FIG. 4B depicts the structure after the pillar pattern is etched through the second sacrificial oxide layer 406 to form the pillar openings 410. The etching may be performed either by a dry etch process or a wet etch process. The etching may be selective such that it stops etching at the first stacked conductive layer 314.

Figure 4C:
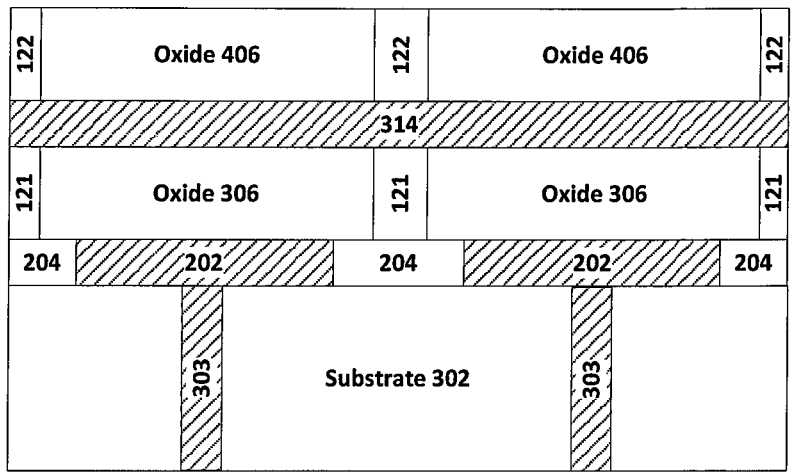

FIG. 4C depicts the structure after the pillar material for the second layer of pillars 122 is deposited and then the surface is planarized. In one embodiment, the pillar material may be silicon nitride or silicon oxynitride, for example.

Figure 4D:
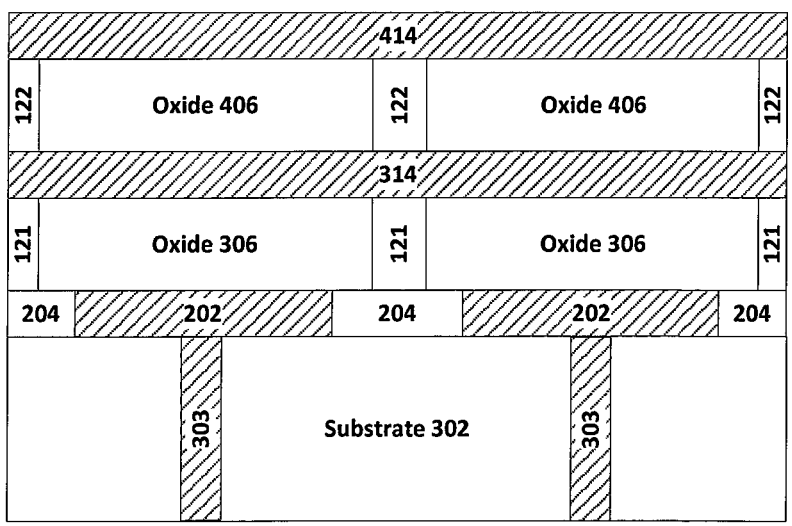

FIG. 4D depicts the structure after a second stacked conductive layer 414 is deposited on the planarized surface. The second stacked conductive layer 414 may be formed by depositing a conductive material. In one embodiment, the second stacked conductive layer 414 may be made of the same metal as the first stacked conductive layer 314 and a different metal as the base electrode pads 202. This enables selective etching of the stacked conductive layers without etching the base electrode pads.

Figure 4E:
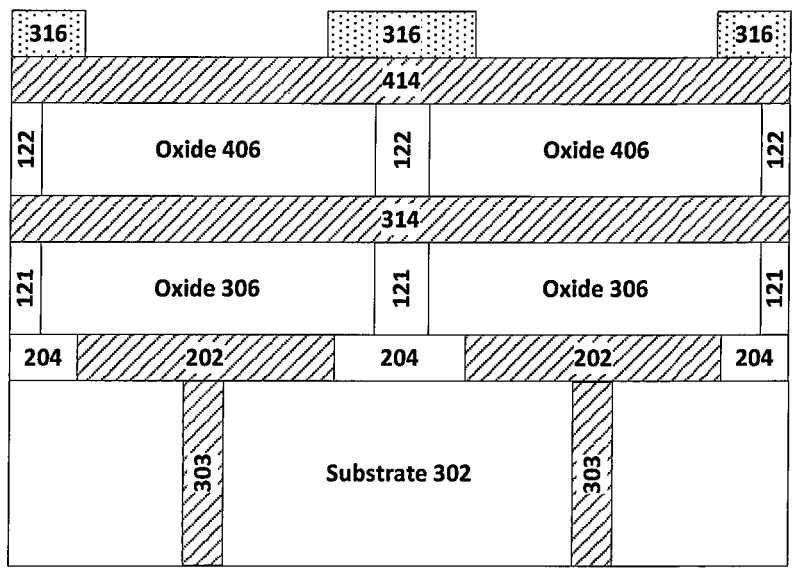

FIG. 4E depicts the structure after the hole-patterned resist layer 316 is formed over the second stacked conductive layer 414. The hole-patterned resist layer 316 has openings for forming the lens holes 130 above the base electrode pads 202.

Figure 4F:
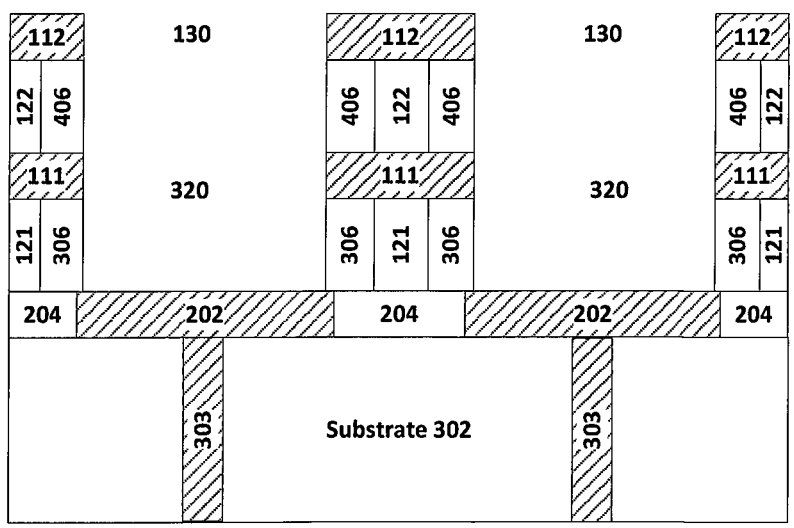
Figure 4G:
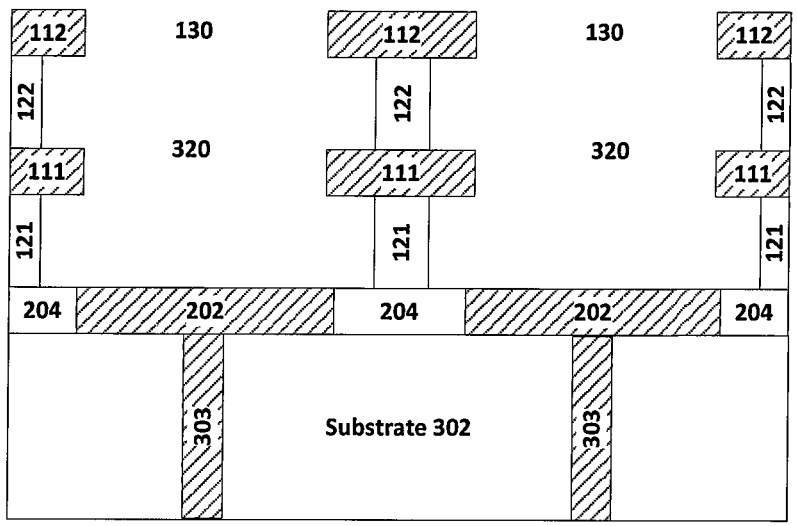

FIG. 4F depicts the structure after etching of the lens holes 130 and removal of the hole-patterned resist layer 316. The lens holes 130 may be etched using a selective etch process (which may include one or more separate etch steps) which selectively etches the stacked conductive layers (414 and 314) and the oxide layers (406 and 306) and stops at the metal of the base electrode pads 202. Finally, FIG. 4G depicts the structure after the remaining oxide (406 and 306) around the pillars (112 and 111) is etched away. The result is a pillar-supported array of micro electron lenses that includes two stacked electrode layer over the base electrode pad array. Note that, as depicted in the perspective view of FIG. 1, there are two open spaces 135 between each pair of adjacent lens holes 320.

FIGS. 5A through 5G are cross-sectional diagrams illustrating steps in a process of manufacturing a pillar-supported micro electron lens array with three stacked electrode layers in accordance with an embodiment of the invention. The process begins with the same steps as described above in relation to FIGS. 3A to 3F, followed by the steps described above in relation to FIGS. 4A to 4D. In other words, the process includes the steps described above in relation to 3A to 3F, followed by the steps described above in relation to FIGS. 4A to 4D, followed by the steps described below in relation to FIGS. 5A to 5G.

Figure 5G:
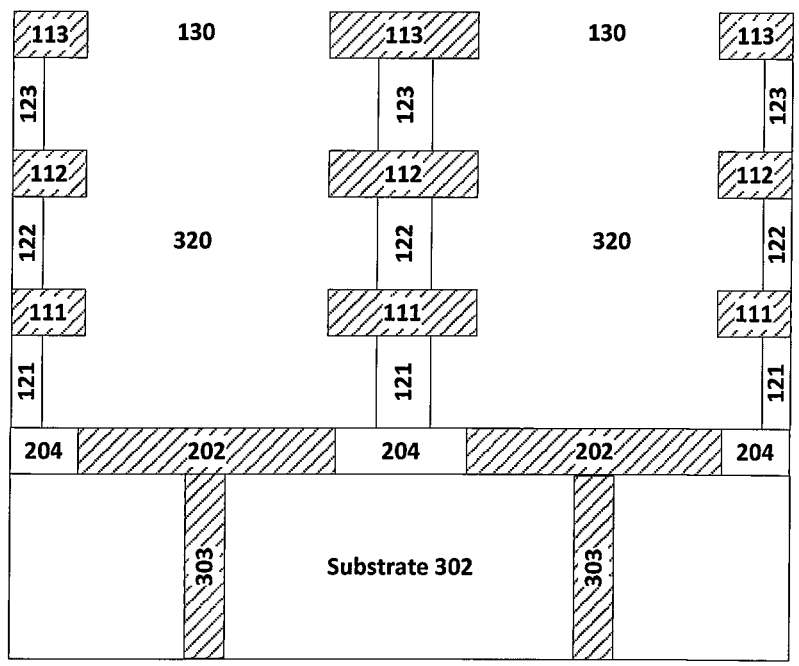
FIGS. 5A through 5G are cross-sectional diagrams illustrating steps in a process of manufacturing a pillar-supported micro electron lens array with three stacked electrode layers in accordance with an embodiment of the invention.
Figure 5A:
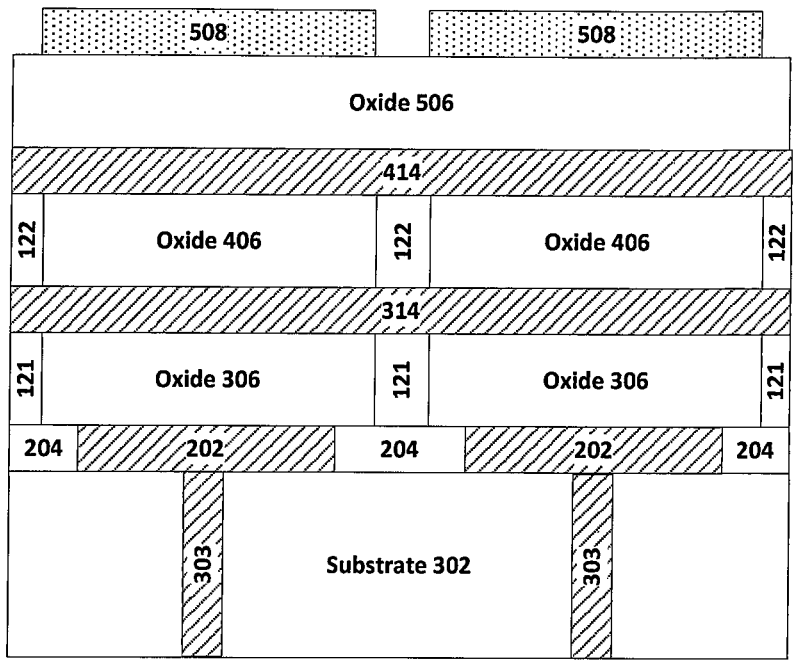

After depositing the second stacked conductive layer 414 per FIG. 4D, a third sacrificial oxide layer 506 is deposited, and a third pillar-patterned resist layer 508 is formed on the third sacrificial oxide layer 506, as depicted in FIG. 5A. The third pillar-patterned resist layer 508 is patterned with openings corresponding to the positions of the pillars to be formed so as to support the third stacked electrode layer.

Figure 5B:
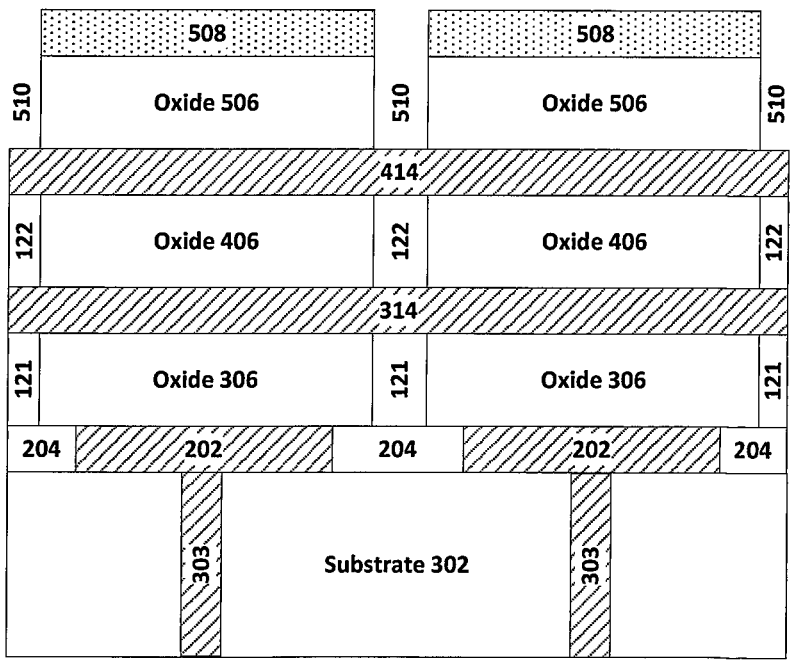

FIG. 5B depicts the structure after the pillar pattern is etched through the third sacrificial oxide layer 506 to form the pillar openings 510. The etching may be performed either by a dry etch process or a wet etch process. The etching may be selective such that it stops etching at the second stacked conductive layer 414.

Figure 5C:
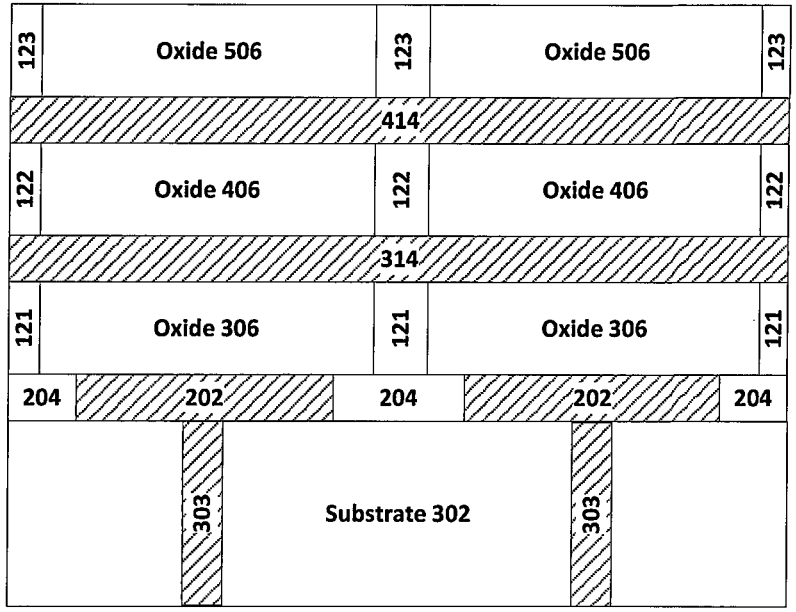

FIG. 5C depicts the structure after the pillar material for the third layer of pillars 123 is deposited and then the surface is planarized. In one embodiment, the pillar material may be silicon nitride or silicon oxynitride, for example.

Figure 5D:
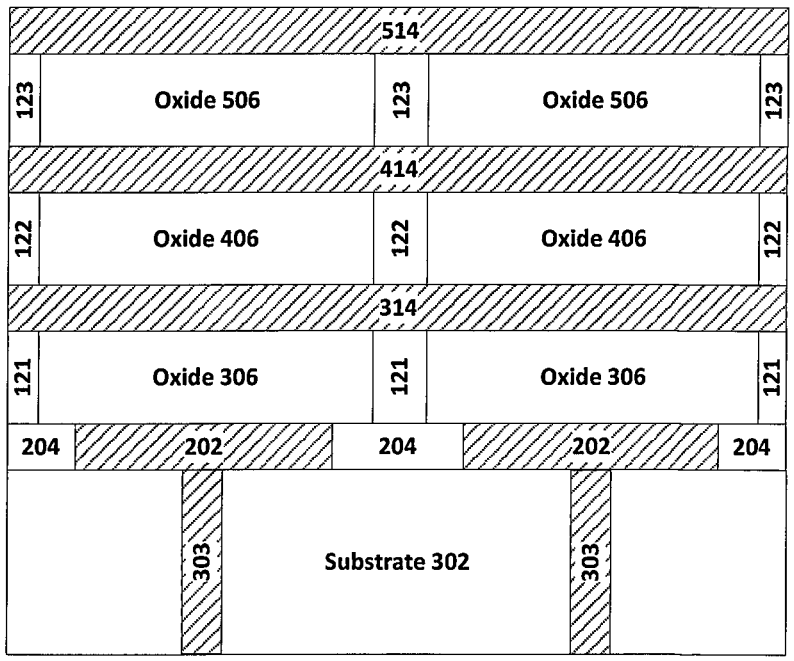

FIG. 5D depicts the structure after a third stacked conductive layer 514 is deposited on the planarized surface. The third stacked conductive layer 514 may be formed by depositing a conductive material. In one embodiment, the third stacked conductive layer 514 may be made of the same metal as the first and second stacked conductive layer (314 and 414) and a different metal as the base electrode pads 202. This enables selective etching of the stacked conductive layers without etching the base electrode pads.

Figure 5E:
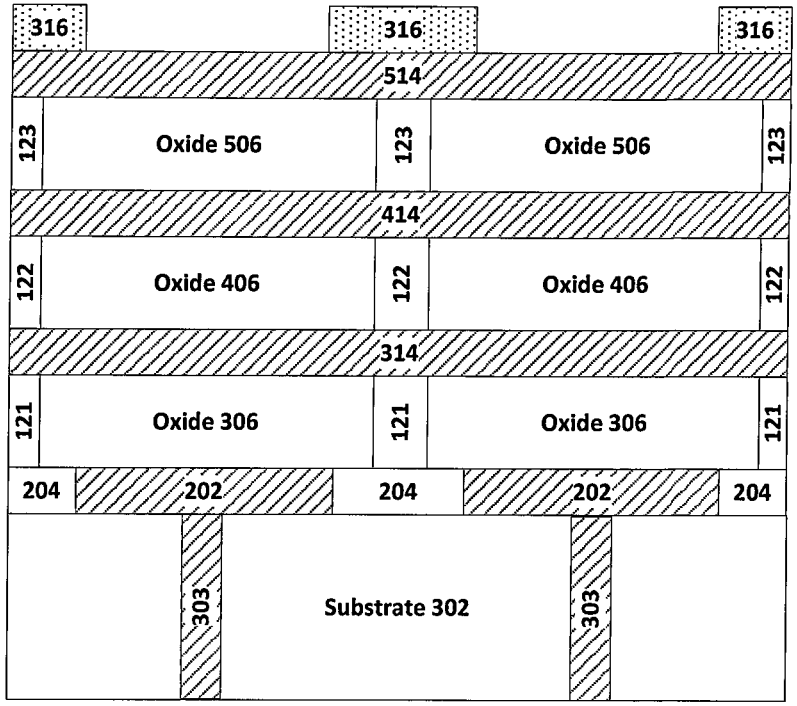

FIG. 5E depicts the structure after a hole-patterned resist layer 316 is formed over the third stacked conductive layer 514. The hole-patterned resist layer 316 has openings for forming the lens holes 130 above the base electrode pads 202.

Figure 5F:
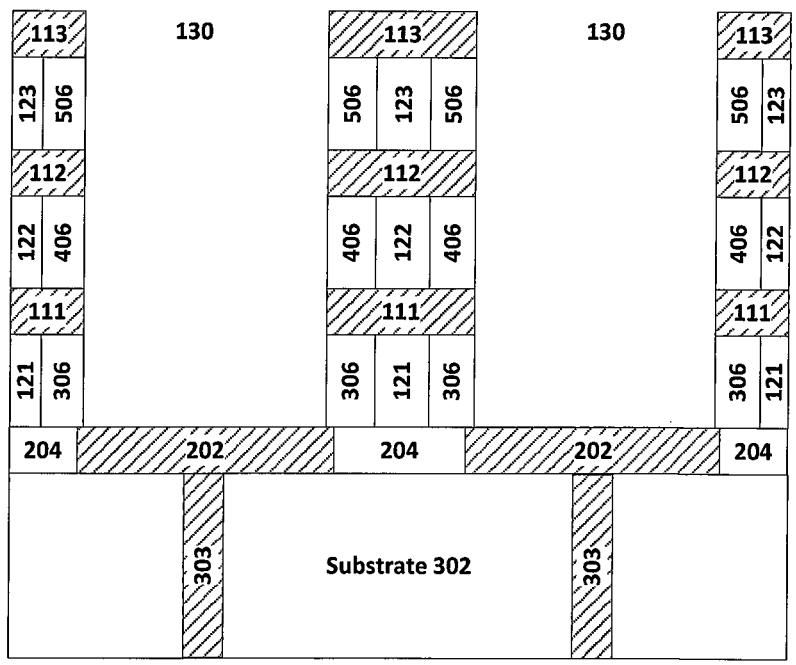

FIG. 5F depicts the structure after etching of the lens holes 130 and removal of the hole-patterned resist layer 316. The lens holes 130 may be etched using an etch process (which may include one or more separate etch steps) which selectively etches the stacked conductive layers (514, 414 and 314) and the oxide layers (506, 406 and 306) and stops at the metal of the base electrode pads 202. Finally, FIG. 5G depicts the structure after the remaining oxide (506, 406 and 306) around the pillars (113, 112 and 111) is etched away. The result is a pillar-supported array of micro electron lenses that includes three stacked electrode layer over the base electrode pad array. Note that, as depicted in the perspective view of FIG. 1, there are three open spaces 135 between each pair of adjacent lens holes 320.

FIGS. 6A through 6G are cross-sectional diagrams illustrating steps in a process of manufacturing a pillar-supported micro electron lens array with three stacked electrode layers in accordance with an embodiment of the invention. The process begins with the same steps as described above in relation to FIGS. 3A to 3F, followed by the steps described above in relation to FIGS. 4A to 4D, followed by the steps described above in relation to FIGS. 5A to 5D. In other words, the process includes the steps described above in relation to 3A to 3F, followed by the steps described above in relation to FIGS. 4A to 4D, followed by the steps described above in relation to FIGS. 5A to 5D, followed by the steps described below in relation to FIGS. 6A to 6G.

Figure 6A:
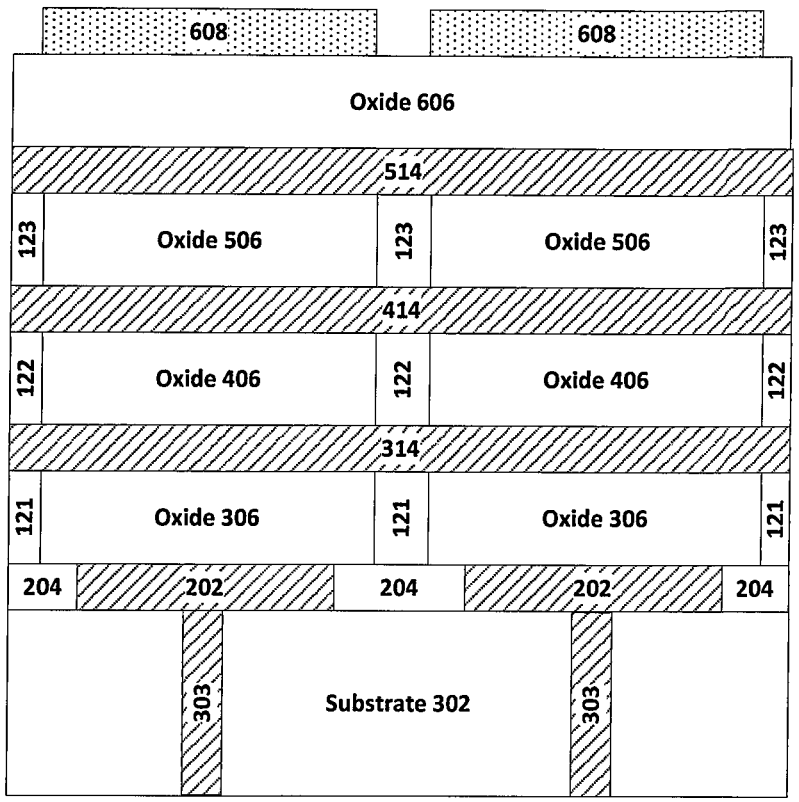
FIGS. 6A through 6G are cross-sectional diagrams illustrating steps in a process of manufacturing a pillar-supported micro electron lens array with four stacked electrode layers in accordance with an embodiment of the invention.

After depositing the third stacked conductive layer 514 per FIG. 5D, a fourth sacrificial oxide layer 606 is deposited, and a fourth pillar-patterned resist layer 608 is formed on the fourth sacrificial oxide layer 606, as depicted in FIG. 6A. The fourth pillar-patterned resist layer 608 is patterned with openings corresponding to the positions of the pillars to be formed so as to support the third stacked electrode layer.

Figure 6B:
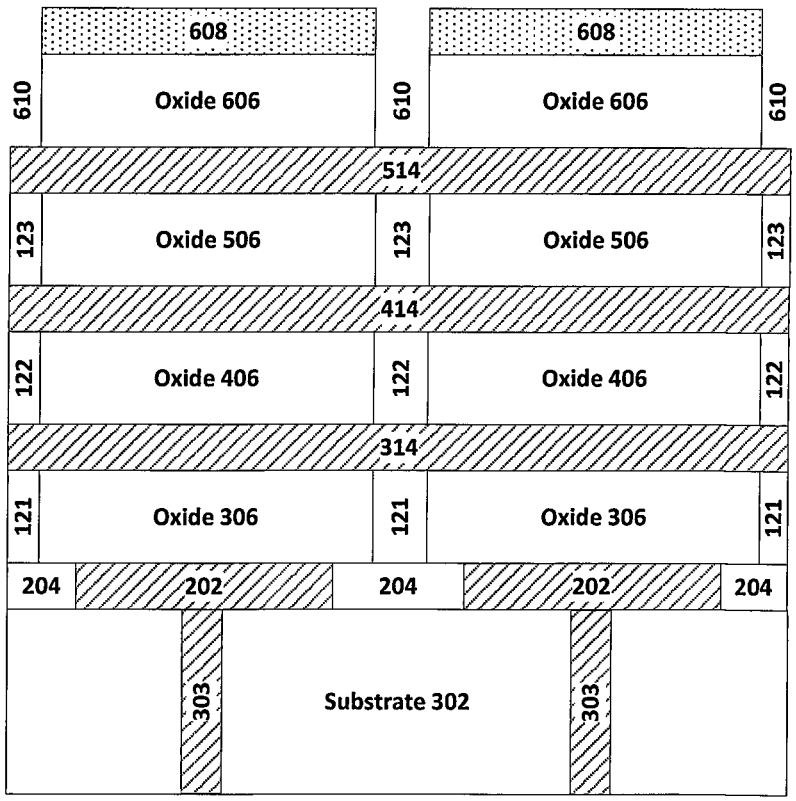

FIG. 6B depicts the structure after the pillar pattern is etched through the fourth sacrificial oxide layer 606 to form the pillar openings 610. The etching may be performed either by a dry etch process or a wet etch process. The etching may be selective such that it stops etching at the third stacked conductive layer 514.

Figure 6C:
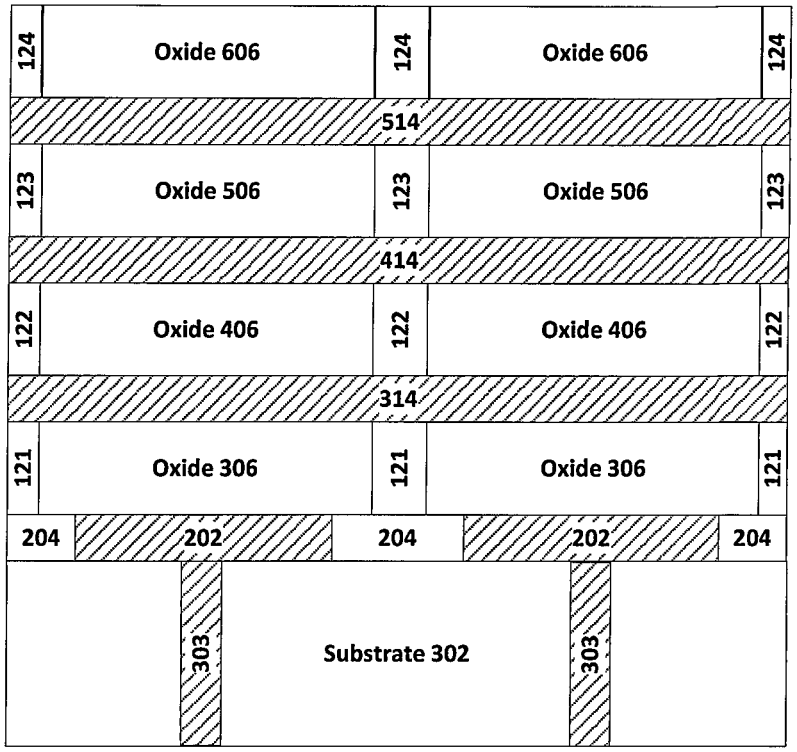
Figure 6D:
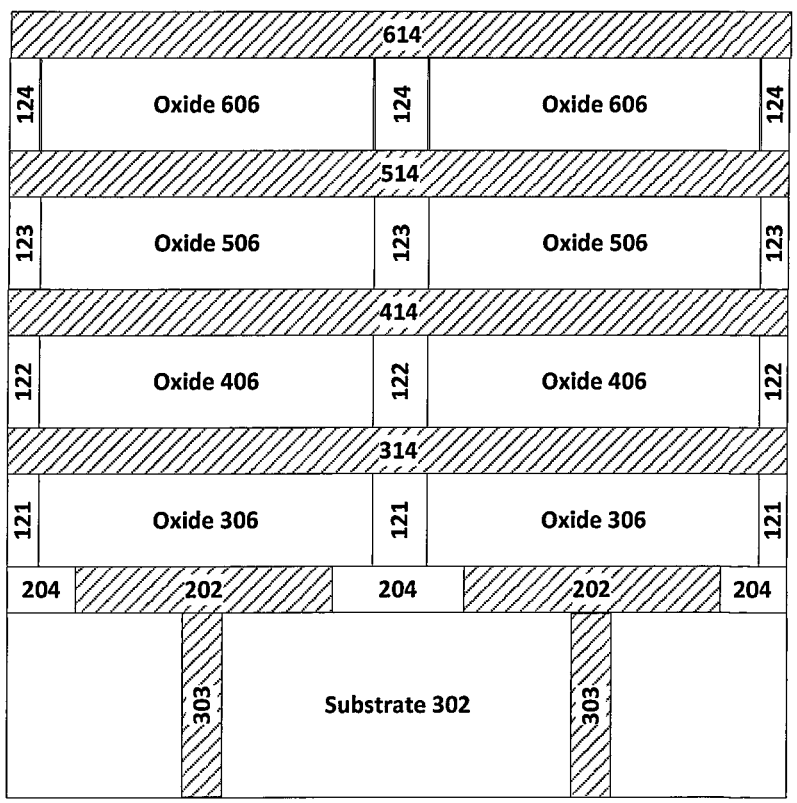

FIG. 6C depicts the structure after the pillar material for the fourth layer of pillars 124 is deposited and then the surface is planarized. In one embodiment, the pillar material may be silicon nitride or silicon oxynitride, for example. FIG. 6D depicts the structure after a fourth stacked conductive layer 614 is deposited on the planarized surface. The fourth stacked conductive layer 614 may be formed by depositing a conductive material. In one embodiment, the fourth stacked conductive layer 614 may be made of the same metal as the first through third stacked conductive layers (314, 414 and 514) and a different metal as the base electrode pads 202. This enables selective etching of the stacked conductive layers without etching the base electrode pads.

Figure 6E:
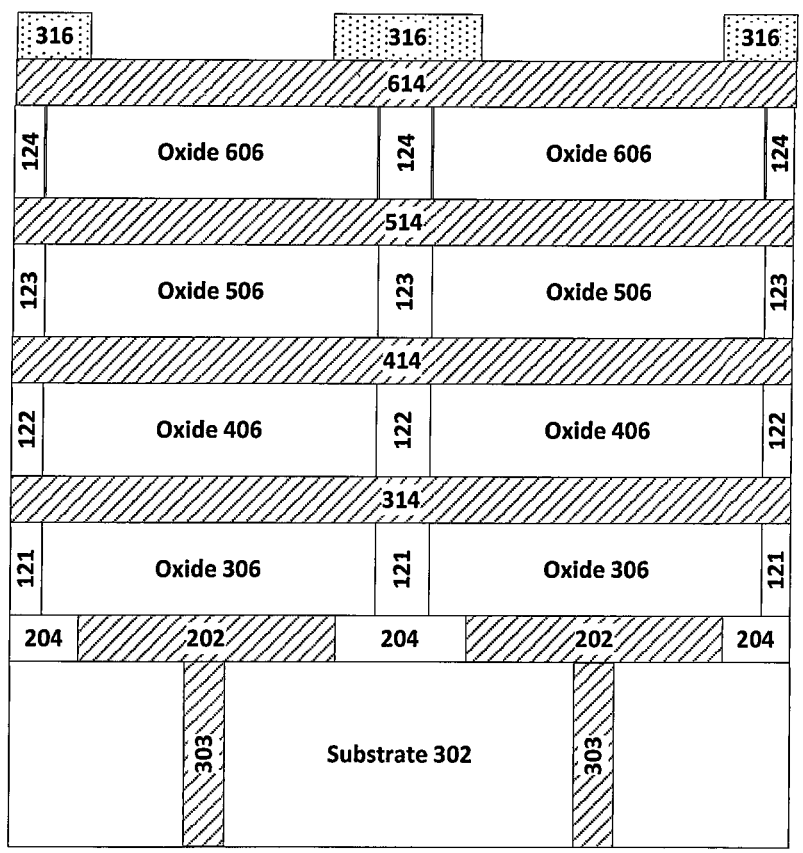

FIG. 6E depicts the structure after a hole-patterned resist layer 316 is formed over the fourth stacked conductive layer 614. The hole-patterned resist layer 316 has openings for forming the lens holes 130 above the base electrode pads 202.

Figure 6F:
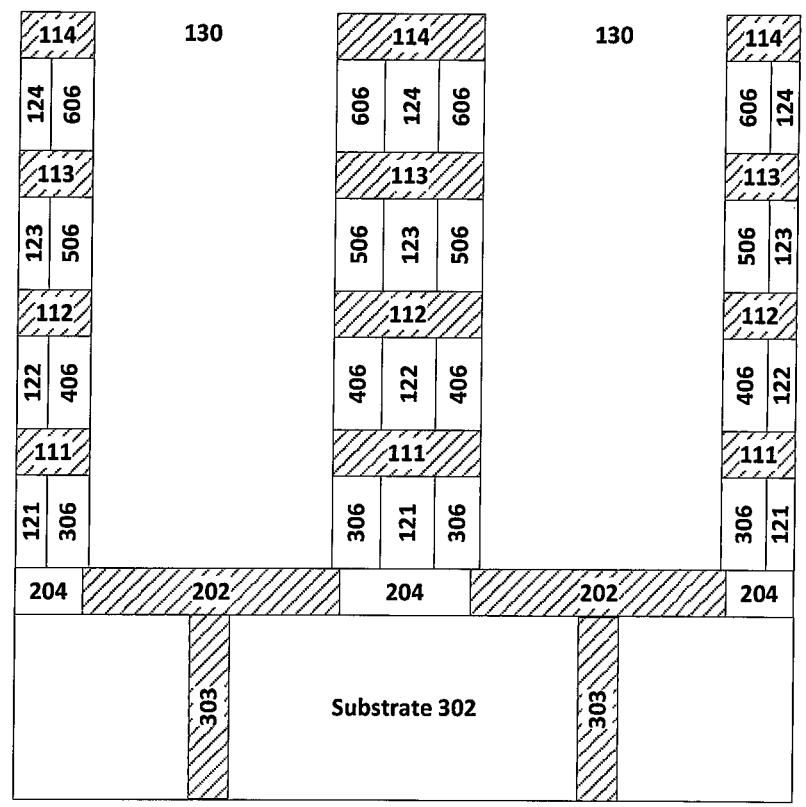
Figure 6G:
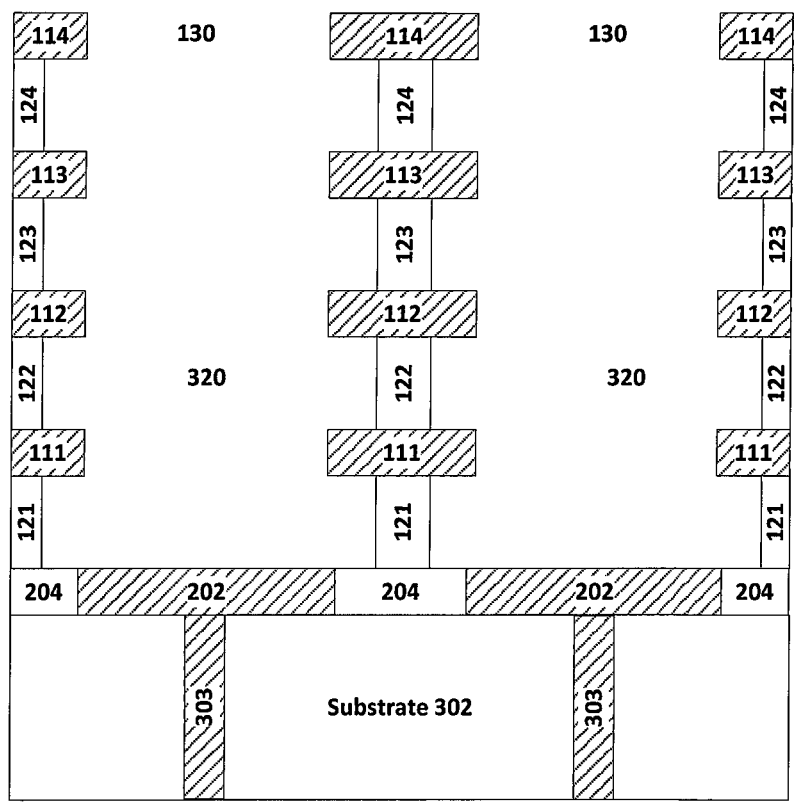

FIG. 6F depicts the structure after etching of the lens holes 130 and removal of the hole-patterned resist layer 316. The lens holes 130 may be etched using an etch process (which may include one or more separate etch steps) which selectively etches the stacked conductive layers (614, 514, 414 and 314) and the oxide layers (606, 506, 406 and 306) and stops at the metal of the base electrode pads 202. Finally, FIG. 6G depicts the structure after the remaining oxide (606, 506, 406 and 306) around the pillars (114, 113, 112 and 111) is etched away. The result is a pillar-supported array of micro electron lenses that includes four stacked electrode layer over the base electrode pad array. Note that, as depicted in the perspective view of FIG. 1, there are four open spaces 135 between each pair of adjacent lens holes 320.

Figure 7:
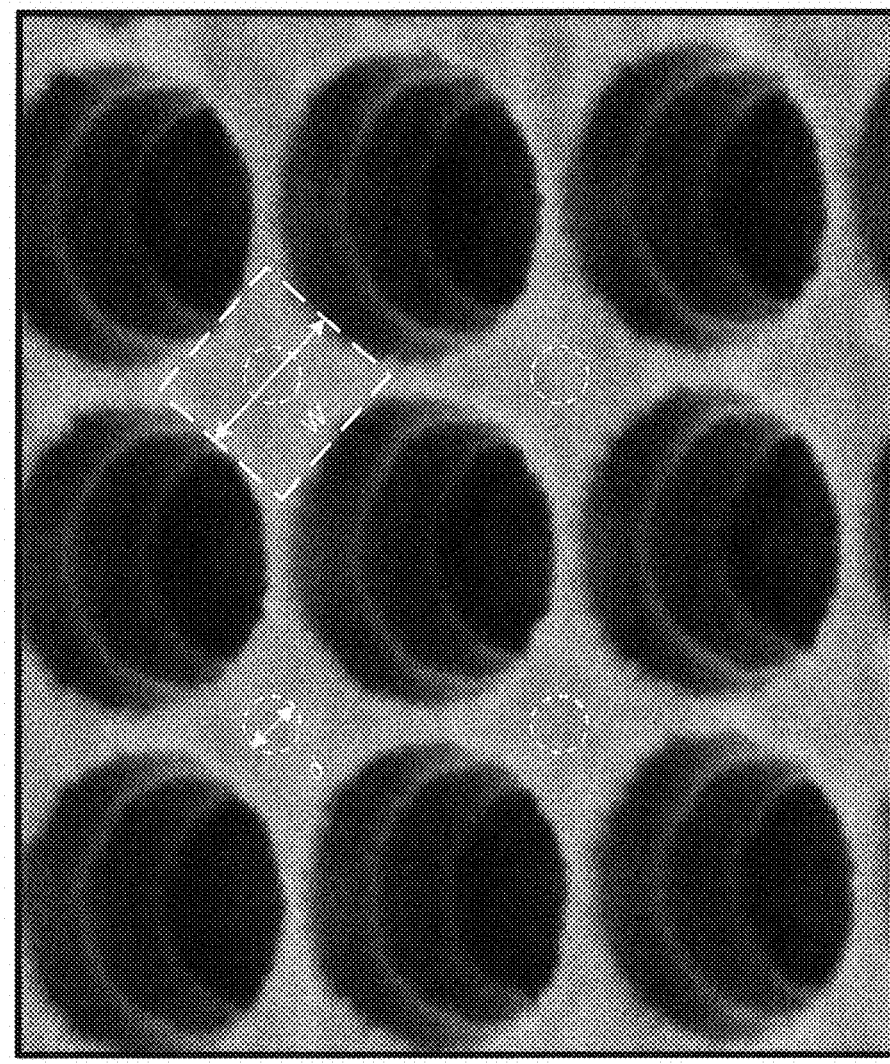
FIG. 7 shows an electron micrograph of a fabricated pentode (four stacked electrodes plus base electrode pad) array.

FIG. 7 shows an electron micrograph of a fabricated pentode (four stacked electrodes plus base electrode pad) array. The depicted device is actually a previous design where there is a well with sidewalls above each base electrode pad, rather than the pillar-based support. Shown with dashed circles is the positioning of the support pillars which would lie under the surface in accordance with an embodiment of the invention.

The widest span d of the cross-section of each support pillar (e.g., the diameter if the pillar has a circular cross-section) may be less than one-half of the width W of the largest square (shown as a dashed square) which fits into the interstitial region between a 2×2 sub-array of four lens holes. As shown in the exemplary implementation depicted in FIG. 7, d is about one-third of W. Of course, the dimensions of a particular array may vary depending on the implementation and use of the array.

Figure 8:
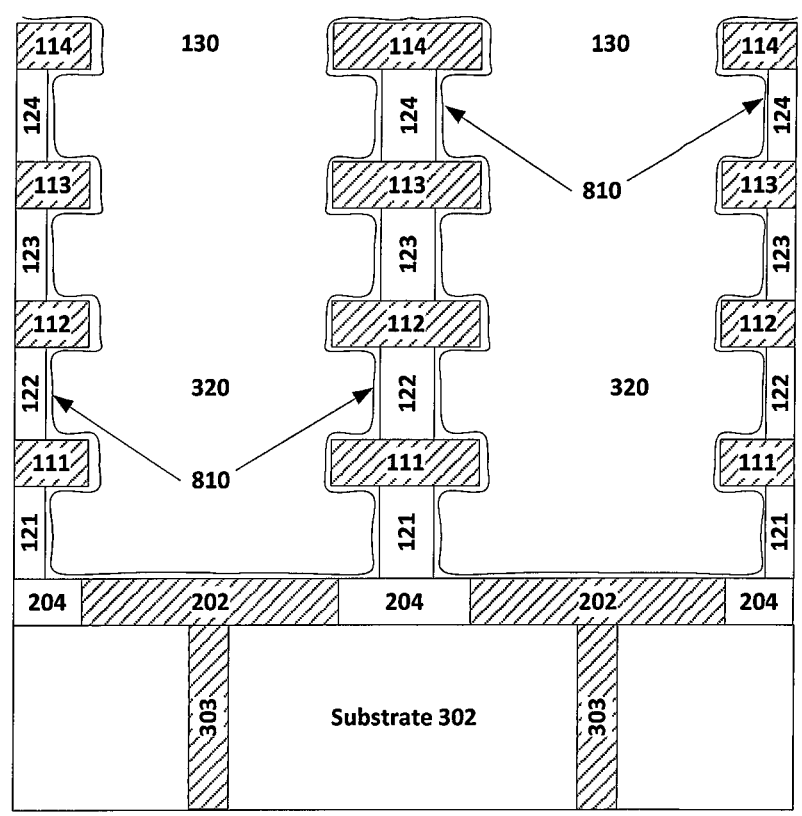
FIG. 8 shows a conformal coating applied to surfaces of the electrodes and insulating pillars in accordance with an embodiment of the invention.

FIG. 8 shows a conformal conductive coating 810 applied to surfaces of the electrodes and insulating pillars in accordance with an embodiment of the invention. Applicants believe that such a conformal coating may advantageously serve to reduce or drain charge that otherwise builds up on the surfaces of the insulating materials (such as the insulating pillars) while being of sufficiently high resistance so as not to substantially perturb the electromagnetic field produced by the electrodes.

In accordance with an embodiment of the invention, the conformal coating may be a nanolaminate of alumina and a metal. For example, the conformal coating may be applied using atomic layer deposition (ALD), and the materials deposited may be alumina and molybdenum. Other conformal coatings that may be used include an ALD coating of ZnO and $Al_2O_3$, a carbon coating, and a diamond like carbon (DLC) coating.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A pillar-supported array of micro electron lenses, the pillar-supported array comprising:
   a base layer on a substrate, the base layer including an array of base electrode pads;
   an insulating border surrounding each base electrode pads so as to electrically isolate the base electrode pads from each other;
   an array of lens holes aligned with the array of base electrode pads;
   a first stacked electrode layer having a first array of openings aligned with the array of lens holes; and
   a first layer of insulating pillars which support the first stacked electrode layer above the base layer.

2. The pillar-supported array of claim 1, further comprising:
   a second stacked electrode layer having openings aligned with the array of lens holes; and
   a second layer of insulating pillars which support the second stacked electrode layer above the first stacked electrode layer.

3. The pillar-supported array of claim 2, further comprising:

a third stacked electrode layer having openings aligned with the array of lens holes; and a third layer of insulating pillars which support the third stacked electrode layer above the second stacked electrode layer.

4. The pillar-supported array of claim 3, further comprising:

a fourth stacked electrode layer having openings aligned with the array of lens holes; and a fourth layer of insulating pillars which support the fourth stacked electrode layer above the third stacked electrode layer.

5. The pillar-supported array of claim 1, wherein there is at least one open space between each pair of adjacent lens holes.

6. The pillar-supported array of claim 5, wherein there are no sidewalls between each pair of adjacent lens holes.

7. The pillar-supported array of claim 5, wherein a widest span of an insulating pillar is less than one-half a width of a largest square that fits into an interstitial region between four of the openings.

8. The pillar-supported array of claim 1, wherein the insulating pillars are formed using a nitride or an oxynitride.

9. The pillar-supported array of claim 1 further comprising:
a conformal coating over surfaces of the electrodes and insulating pillars.

10. The pillar-supported array of claim 9, wherein the conformal coating comprises a nanolaminate of alumina and a metal.

11. A method of fabricating a pillar-supported array of micro electron lenses, the method comprising:

forming a base layer on a substrate, the base layer including an array of base electrode pads separated by insulating material;

forming a first stacked electrode layer above the base layer;

forming a first array of insulating pillars that support the first stacked electrode layer above the base layer; and forming an array of lens holes, the array of lens holes being aligned to the array of base electrode pads.

12. The method of claim 11 further comprising:

forming a second stacked electrode layer above the first stacked electrode layer;

forming a second array of insulating pillars that support the second stacked electrode layer above the first stacked electrode layer.

13. The method of claim 12 further comprising:

forming a third stacked electrode layer above the second stacked electrode layer; and forming a third array of insulating pillars that support the third stacked electrode layer above the second stacked electrode layer.

14. The method of claim 13 further comprising:

forming a fourth stacked electrode layer above the third stacked electrode layer; and forming a fourth array of insulating pillars that support the fourth stacked electrode layer above the third stacked electrode layer.

15. The method of claim 11, wherein forming the array of lens holes comprises:

selectively etching a dielectric material while leaving the insulating pillars.

16. The method of claim 15, wherein the dielectric material comprises an oxide and the insulating pillars comprise a nitride or an oxynitride.

17. The method of claim 11 further comprising:

depositing a conformal coating over surfaces of the electrodes and insulating pillars.

18. The method of claim 17, wherein depositing the conformal coating comprises atomic layer deposition of molybdenum and alumina.

19. A device for dynamically patterning an electron beam, the device comprising:

a base layer on a substrate, the base layer including an array of base electrode pads to which individually-controllable voltages are applied;

an insulating border surrounding each base electrode pads so as to electrically isolate the base electrode pads from each other;

an array of lens holes aligned with the array of base electrode pads;

a plurality of stacked electrode layers, each stacked electrode layer having an array of openings aligned with the array of lens holes; and a plurality of layers of insulating pillars, each layer of insulating pillars supporting one stacked electrode layer.

20. The device of claim 19, further comprising:
open spaces between each pair of adjacent lens holes.

* * * * *